(12) United States Patent
Yang et al.

(10) Patent No.: US 7,573,017 B2
(45) Date of Patent: Aug. 11, 2009

(54) PIXEL SENSORS USING NONLINEAR CAPACITANCE WITH LOGARITHMIC CHARACTERISTICS

(75) Inventors: Kyoung Hoon Yang, Daejon (KR); Ha Joon Lee, Daejon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 49 days.

(21) Appl. No.: 11/859,086

(22) Filed: Sep. 21, 2007

(65) Prior Publication Data

US 2009/0039236 A1    Feb. 12, 2009

(30) Foreign Application Priority Data

Aug. 7, 2007    (KR) ...................... 10-2007-0078866

(51) Int. Cl.
*H01J 40/14*    (2006.01)
*H01L 27/00*    (2006.01)

(52) U.S. Cl. ................................. 250/214 R; 250/208.1
(58) Field of Classification Search .............. 250/208.1, 250/214 R, 214.1; 348/272, 281–283, 294–324; 257/290–292, 440
See application file for complete search history.

(56) References Cited

U.S. PATENT DOCUMENTS 6,054,704 A * 4/2000 Pritchard et al. ......... 250/208.1
6,654,057 B1 * 11/2003 Rhodes ....................... 348/294

2008/0070341 A1 * 3/2008 Yuzurihara ................... 438/59
2008/0266434 A1 * 10/2008 Sugawa et al. .............. 348/308

OTHER PUBLICATIONS

GG. Storm, J.E.D. Hurwitz, D. Rensaw, K.M. Findlater, R.K. Henderson, and M.D. Purcell, "Combined Linear-Logarithmic CMOS Image Sensor," 2004 IEEE International Solid-State Circuits Conference, Jun. 2004.
Sungsik Lee, and Kyounghoon Yang, "High Dynamic-Range CMOS Image Sensor Cell Based on Self-Adaptive Photosensing Operation," IEEE Transactions On Electron Devices, vol. 53, pp. 1733-1735, Jul. 2006.

* cited by examiner

*Primary Examiner*—Que T Le
*Assistant Examiner*—Pascal M Bui-Pho
(74) *Attorney, Agent, or Firm*—Adam K. Sacharoff; Much Shelist

(57) ABSTRACT

Disclosed herein is an active pixel sensor having a first transistor amplifying voltage generated in response to light at an integration node; a second transistor selects a specific pixel from a pixel array; a third transistor resets voltage of the integration node to voltage supplied from VDD during a reset period; a fourth transistor connects a photogate capacitance to the integration node increasing a dynamic range when the voltage of the integration node is VDD-Vth; a fifth transistor generates a signal voltage in a logarithmic response to light when the voltage of the integration node is logarithmic bias voltage-Vth; and a photodiode to convert photons into electron pairs in a depletion layer, causing signal charges to be accumulated when light is incident from outside.

9 Claims, 3 Drawing Sheets

PIXEL SENSORS USING NONLINEAR CAPACITANCE WITH LOGARITHMIC CHARACTERISTICS

BACKGROUND OF THE INVENTION

1. Field of the Invention

The present invention relates, generally, to an active pixel sensor, and, more particularly, to an active pixel sensor, that combines nonlinear capacitance characteristics with logarithmic characteristics, thereby having a high dynamic range, compared to the existing pixel sensors.

2. Description of the Related Art

Currently, image sensors are used in various fields, such as mobile device, camera, surveillance camera, and car camera fields, and the image sensors are required to have a relatively wide dynamic range. Therefore, image sensors employ a logarithmic pixel structure, in which voltage follows a log function in response to incident light. However, the logarithmic pixel structure has characteristics in which response to light is slow when light is weak, and the total output voltage range is narrow, that is, the total output voltage range corresponds to a few millivolts (mV), and thus the logarithmic pixel structure is vulnerable to noise.

In order to overcome theses problems, a linear-logarithmic structure has been proposed. In this structure, a linear response appears when light is weak, and a logarithmic response appears when light is strong. However, this structure also has defects in that an image may appear unnatural because the response suddenly switches from a linear response to a logarithmic response, and in that the photodiode characteristics for a linear section are not optimal.

In particular, in the case of the existing linear-logarithmic pixels, a dynamic range of about 140 dB is realized when a voltage of 3.3 V is used. That is, the dynamic range for the linear section is about 60 dB, and the dynamic range for the logarithmic response is about 80 dB. In such a pixel, when the supply voltage drops, the output voltage range for the linear section is narrow, and thus the dynamic range decreases. Further, since the output voltage range for the linear section has a major effect on the total Signal-to-Noise Ratio (SNR), there is a defect in that the SNR is low. In addition, since a photodiode uses a PN junction, which forms a linear section, there is a defect in that it is vulnerable to noise and the linear dynamic range is narrow (refer to "Combined Linear-Logarithmic Image Sensor" by G. G. Strom in ISSCC 2004).

Further, a pixel structure using nonlinear capacitance is used as another method of increasing dynamic range. In this structure, a photodiode is surrounded with a photogate, so that dark current flowing through the photodiode is decreased and responsivity is increased. In addition, when the dynamic range is increased using the capacitance of a photogate, the dynamic range is 75 dB.

Currently, since the dynamic range of a well-manufactured Charge Coupled Device (CCD) is 72 dB, the above-described pixel structure does not have a significant industrial advantage in view of the dynamic range. Accordingly, only when the dynamic range is equal to or greater than 120 dB, which is almost the same as the dynamic range of human eyes, is the advantage of a high dynamic range pixel obtained. Further, in the case of the existing pixel, an additional bias voltage should be applied to a photogate. Therefore, the fill factor is decreased due to an additional voltage line.

SUMMARY OF THE INVENTION

Accordingly, the present invention has been made keeping in mind the above problems occurring in the prior art, and an object of the present invention is to provide an active pixel sensor, in which a nonlinear response is achieved using a photogate and a capacitance in addition to a PN junction, thereby increasing the dynamic range for a linear section compared to the existing sensor, so that the total dynamic range, including a logarithmic response, is increased, and in which a P-channel Metal-Oxide Semiconductor (PMOS) is used as a reset transistor, so that the voltage range for a linear section is increased, and an additional voltage line is not required because the voltage of the node of the photogate is combined with an applied voltage.

In order to achieve the above object, the present invention provides an active pixel sensor, including a first transistor for amplifying voltage generated in response to light at an integration node N; a second transistor functioning as a selecting transistor, the second transistor selecting a specific pixel from a pixel array; a third transistor for resetting voltage of the integration node N to voltage supplied from VDD during a reset period; a fourth transistor functioning as a photogate, the fourth transistor connecting a photogate capacitance to the integration node N and thus increasing the dynamic range when the voltage of the integration node N is VDD-Vth (photogate: fourth transistor); a fifth transistor functioning as a logarithmic transistor, the fifth transistor generating a signal voltage in logarithmic response to light when the voltage of the integration node N is logarithmic bias voltage-Vth (logarithmic TRansistor (TR): fifth transistor); and a photodiode, for converting photons into electron pairs in a depletion layer, and then causing signal charges to be accumulated when light is incident from an outside.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The features and advantages of the present invention will be apparent from the following description, made in conjunction with the accompanying drawings. Terms and words used in the present specification and claims should be interpreted as having meanings and concepts in conformity with the technical sprit of the present invention based on the principal in which an inventor can appropriately define the concepts of terms in order to describe the inventor's own invention using the best method. It should be noted that, in the following description, when it is determined that the detailed descriptions of well-known functions related to the present invention and the construction thereof would make the gist of the present invention obscure, they are omitted.

The present invention will be described in detail with reference to the accompanying drawings below.

Figure 1:
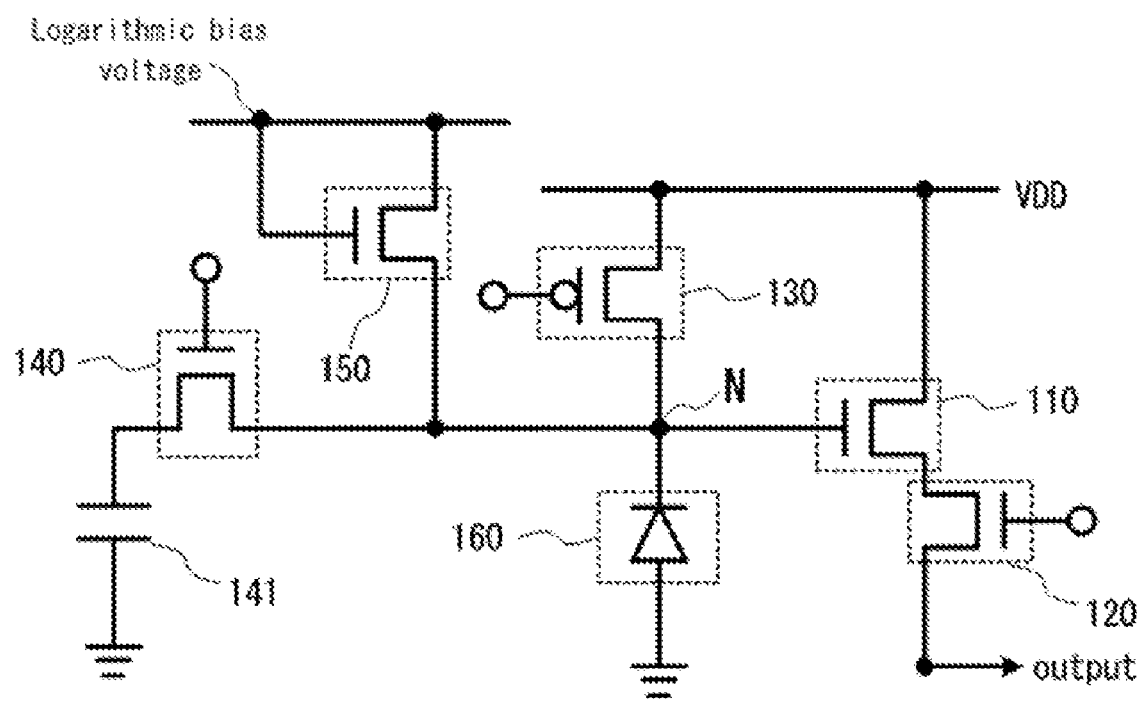
FIG. 1 is an equivalent circuit diagram of an active pixel sensor according to the present invention.
Figure 2:
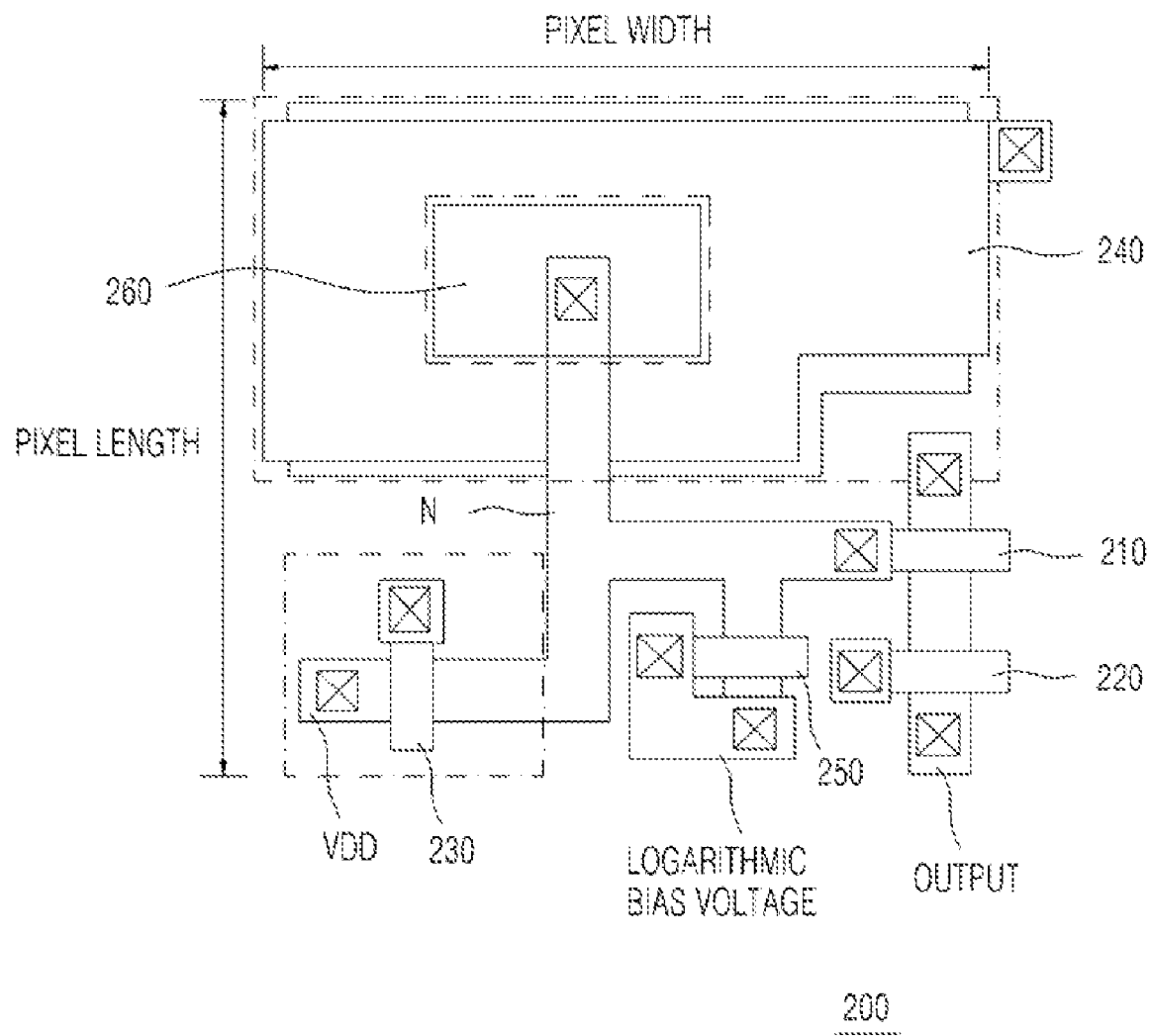
FIG. 2 is a view showing an example of the pixel layout of the active pixel sensor according to the present invention.

FIG. 1 is an equivalent circuit diagram of an active pixel sensor 100 according to the present invention, and FIG. 2 is a view showing an example of the layout 200 of the active pixel sensor 100 according to the present invention. As shown in FIGS. 1 and 2, a first transistor 110 or 210 is a source follower, and performs a function of amplifying voltage generated in response to light at an integration node N.

The gate of the first transistor 110 or 210 is connected to the source of a third transistor 130 or 230, the cathode of a photodiode 160 or 260, the source of a fourth transistor 140 or 240, and the source of a fifth transistor 150 or 250. The source of the first transistor 110 or 210 is connected to the drain of the second transistor 120 or 220. The drain of the first transistor 110 or 210 is connected to a power source VDD.

The second transistor 120 or 220 is a select transistor, and performs a function of selecting a predetermined pixel from a pixel array. The drain of the second transistor 120 or 220 is connected to the source of the first transistor 110 or 210, and the source of the second transistor 120 or 220 is connected to the source of an output node.

The third transistor 130 or 230 is a reset transistor, formed of a P-channel Metal-Oxide Semiconductor (PMOS), and performs a function of resetting the voltage of the integration node N to voltage supplied from the power source VDD during a reset period. The gate of the third transistor 130 or 230 receives a reset signal, the drain thereof is connected to the VDD, and the source thereof is connected to the gate of the first transistor 110 or 210, the cathode of the photodiode 160 or 260, the source of the fourth transistor 140 240, and the source of the fifth transistor 150 or 250.

The fourth transistor 140 or 240 is a photogate, when the voltage of the integration node N is VDD-Vth (photogate), and the photogate performs a function of increasing the dynamic range by connecting a photogate capacitance 141 to the integration node N. The gate of the fourth transistor 140 or 240 is connected to the VDD.

Although the drain of the fourth transistor 140 is illustrated as being connected to the photogate capacitance 141 in the equivalent circuit diagram of FIG. 1, the drain of the fourth transistor 240 is floating in an actual layout, as shown in FIG. 2. The reason for this is that the layout is modeled on a structure in which a channel is formed on a fourth transistor, and thus a gate-channel capacitance is connected to the integration node N. Therefore, the source of the fourth transistor 140 or 240 is connected to the gate of the first transistor 110 or 210, the source of the third transistor 130 or 230, the cathode of the photodiode 160 or 260, and the source of the fifth transistor 150 or 250.

The fifth transistor 150 or 250 is a logarithmic transistor, and performs a function of generating a signal voltage in a logarithmic response to light when the voltage of the integration node N is a logarithmic bias voltage–Vth (logarithmic TRansistor (TR); fifth transistor).

As shown in FIG. 1, the gate of the fifth transistor 150 or 250 is connected to the drain thereof and receives the logarithmic bias voltage, and the source thereof is connected to the source of the third transistor 130 or 230, the cathode of the photodiode 160 or 260, and the gate of the first transistor 110 or 210.

The photodiode 160 or 260 has a depletion layer formed by a PN junction. When light is incident from the outside, photons are converted into electron pairs in a depletion layer, and signal charges are accumulated in this way. A cathode of the photodiode 160 or 260 is connected to the gate of the first transistor 150 or 250, the source of the third transistor 130 or 230, and the source of the fifth transistor 150 or 250, and the anode thereof is connected to a GND through p-sub.

A photogate capacitance 141 is a gate capacitance formed between the gate and channel of the photogate. When the voltage of the integration node N drops below a voltage equal to VDD-Vth (photogate: fourth transistor), the fourth transistor 140 or 240 is turned on, and thus the gate capacitance is coupled to the integration node N. This capacitance has a value 25 times larger than the value of capacitance generated in the photodiode 160 or 260, so that the saturation of signal charges is delayed, and thus a larger amount of light can be received.

The operation of the active pixel sensor according to the present invention will be described below.

Figure 3:
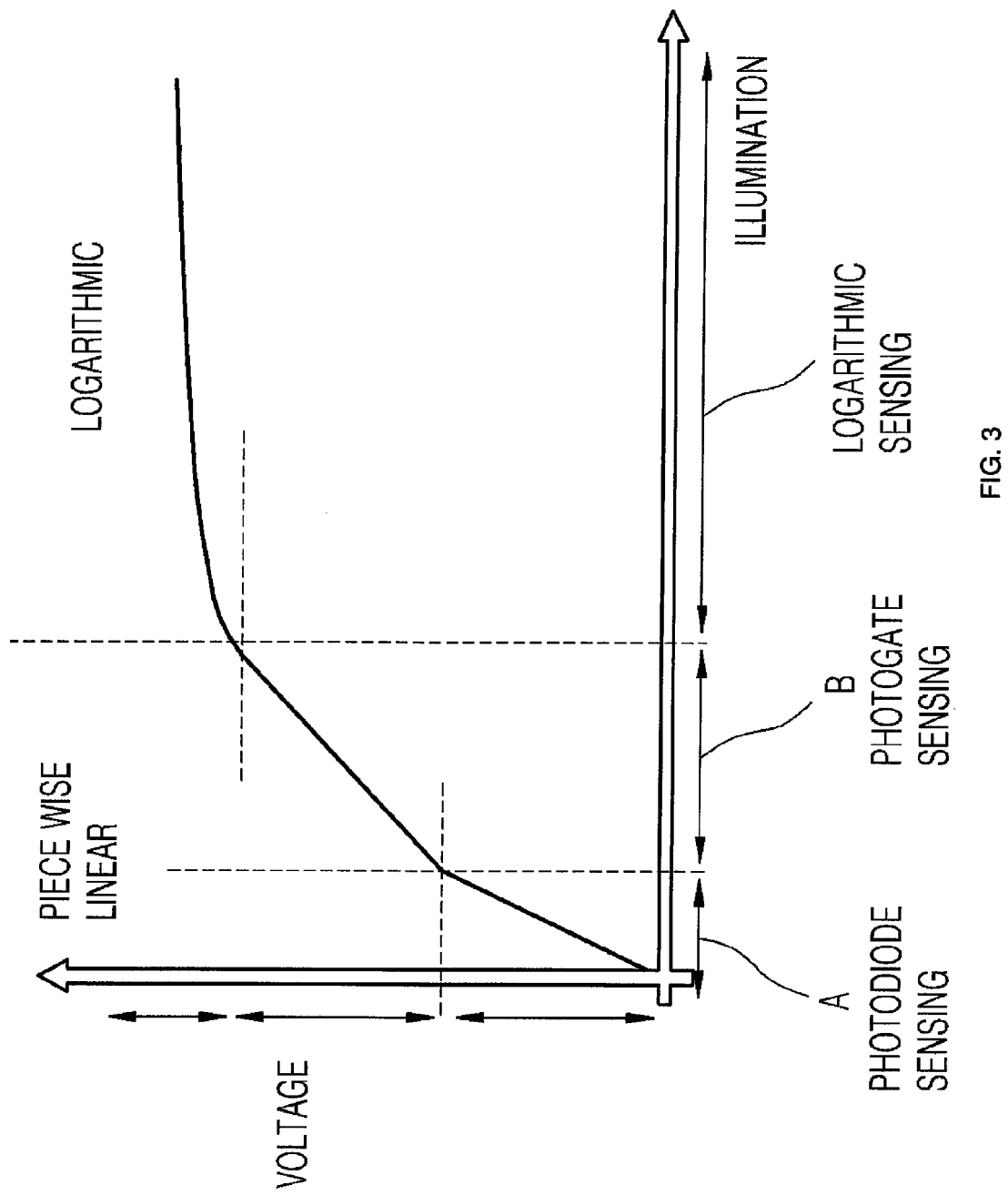
FIG. 3 is a graph showing an example of variation in the output voltage of the active pixel sensor in response to light according to the present invention.

FIG. 3 is a graph showing an example of variation in the output voltage of the active pixel sensor in response to light according to the present invention. As shown in FIG. 3, when a signal is input to the gate of the third transistor 130 or 230, the third transistor 130 or 230 is turned on, and thus the voltage of the integration node N is reset to VDD. The reset voltage drops due to photocurrent, which flows through the photodiode 160 or 260, so that a first linear section 'a' appears, as shown in FIG. 3. When the voltage of the integration node N drops in response to light, and then becomes a voltage equal to VDD-Vth (photogate: fourth transistor), a fourth transistor 140 or 240 is turned on. Therefore, the photogate capacitance 141 is coupled to the integration node N.

In a second linear section 'b', shown in FIG. 3, the capacitance of the photodiode 160 or 260 is coupled to the capacitance of the photogate, so that a larger number of signal charges can be received, thereby increasing the dynamic range. When light is strong and the voltage of the integration node N is equal to logarithmic bias voltage–Vth (logarithmic TR: fifth transistor), a fifth transistor 150 or 250 is turned on, and thus voltage following a log function of the photocurrent that flows through a photodiode exists between the gate and source of the fifth transistor 150.

$$v_{gs} = k \ln \frac{i_{ph}}{I_o} \tag{1}$$

Therefore, a voltage $v_{gs}$ is obtained based on a log function of photocurrent $i_{ph}$, and the value of a logarithmic bias voltage–vgs (logarithmic TR: fifth transistor) is obtained in the integration node N, so that signal voltage, which is insensitive to light, is generated, compared to the piece-wise linear section shown in FIG. 3, thereby significantly increasing the dynamic range.

That is, in the case of the existing self-adaptive pixel, only photogate capacitance is used. Therefore, there is a limitation in the increase of the dynamic range. However, a dynamic range equal to or wider than 100 dB can be achieved by adding a logarithmic transistor to the existing self-adaptive pixel.

According to the present invention, a nonlinear response is achieved using a photogate and a capacitance in addition to a PN junction, thereby increasing a dynamic range for a linear section compared to the existing sensors, so that there is an advantage in that the total dynamic range, including logarithmic response, increases.

Further, according to the present invention, a PMOS is used as a reset transistor, so that a voltage range for a linear section increases, and the voltage of the node of a photogate is combined with applied voltage, with the result that there is another advantage in that no additional voltage line is required.

As described above, although the descriptions and illustrations have been made in conjunction with the preferred embodiments in order to illustrate the technical sprit of the present invention, the present invention is not limited to the illustrated and described construction and operation, rather, it will be understood by those skilled in the art that various variations and modifications can be made without departing from the scope of the technical spirit of the present invention. Therefore, all appropriate variations, modifications and equivalents must be considered to fall within the technical scope of the present invention.

What is claimed is:

1. An active pixel sensor, comprising:
   a first transistor for amplifying voltage generated in response to light at an integration node N;
   a second transistor functioning as a selecting transistor, the second transistor selecting a specific pixel from a pixel array;
   a third transistor resetting voltage of the integration node N to voltage supplied from VDD during a reset period;
   a fourth transistor functioning as a photogate, the fourth transistor connecting a photogate capacitance to the integration node N and thus increasing a dynamic range when the voltage of the integration node N is VDD-Vth (photogate: fourth transistor);
   a fifth transistor functioning as a logarithmic transistor, the fifth transistor generating a signal voltage in a logarithmic response to light when the voltage of the integration node N is logarithmic bias voltage−Vth (logarithmic TRansistor (TR): fifth transistor); and
   a photodiode, for converting photons into electron pairs in a depletion layer, and then causing signal charges to be accumulated when light is incident from outside.

2. The active pixel sensor as set forth in claim 1, wherein the first transistor is a source follower.

3. The active pixel sensor as set forth in claim 1, wherein the third transistor is a P-channel Metal-Oxide Semiconductor (PMOS)-type reset transistor.

4. The active pixel sensor as set forth in claim 1, wherein the photodiode comprises the depletion layer formed by a PN junction.

5. The active pixel sensor as set forth in claim 1, wherein the first transistor has a gate, connected to a source of the third transistor, a cathode of the photodiode, a source of the fourth transistor, and a source of the fifth transistor, has a source connected to a drain of the second transistor, and has a drain connected to the VDD.

6. The active pixel sensor as set forth in claim 1, wherein the second transistor has a drain connected to a source of the first transistor, and a source connected to an output node.

7. The active pixel sensor as set forth in claim 1, wherein the third transistor has a gate to which a rest signal is supplied, has a drain connected to the VDD, and has a source connected to a gate of the first transistor, a cathode of the photodiode, a source of the fourth transistor, and a source of the fifth transistor.

8. The active pixel sensor as set forth in claim 1, wherein the fourth transistor has a gate, connected to the VDD, and has a source connected to a gate of the first transistor, a source of the third transistor, a cathode of the photodiode, and a source of the fifth transistor.

9. The active pixel sensor as set forth in claim 1, wherein the fifth transistor has a gate connected to a drain, to which logarithmic bias voltage is supplied, and has a source connected to a source of the third transistor, a cathode of the photodiode, and a gate of the first transistor.

* * * * *